(12) United States Patent
Kantarovsky et al.

(10) Patent No.: US 11,437,329 B2
(45) Date of Patent: Sep. 6, 2022

(54) ANTI-TAMPER X-RAY BLOCKING PACKAGE

(71) Applicant: GLOBALFOUNDRIES U.S. Inc., Santa Clara, CA (US)

(72) Inventors: Johnatan A. Kantarovsky, South Burlington, VT (US); Vibhor Jain, Williston, VT (US); Siva P. Adusumilli, South Burlington, VT (US); Ajay Raman, Essex Junction, VT (US); Sebastian T. Ventrone, South Burlington, VT (US); Yves T. Ngu, Williston, VT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 0 days.

(21) Appl. No.: 17/070,377

(22) Filed: Oct. 14, 2020

(65) Prior Publication Data
US 2022/0115329 A1 Apr. 14, 2022

(51) Int. Cl.
*H01L 23/552* (2006.01)
*H01L 23/00* (2006.01)
*H01L 23/522* (2006.01)
*H01L 49/02* (2006.01)

(52) U.S. Cl.
CPC ........ *H01L 23/552* (2013.01); *H01L 23/5226* (2013.01); *H01L 23/576* (2013.01); *H01L 28/10* (2013.01); *H01L 28/60* (2013.01); *H01L 2924/3025* (2013.01)

(58) Field of Classification Search
CPC . H01L 23/552; H01L 23/5226; H01L 23/576; H01L 28/10; H01L 28/60; H01L 2924/3025

USPC ......................................................... 257/531
See application file for complete search history.

(56) References Cited

U.S. PATENT DOCUMENTS

| | | |
|---|---|---|
| 6,496,022 B1 | 12/2002 | Kash et al. |
| 6,611,636 B2 | 8/2003 | Delivala |
| 6,748,125 B2 | 6/2004 | Delivala |
| 6,839,488 B2 | 1/2005 | Gunn, III |
| 7,115,912 B2 | 10/2006 | Kash et al. |
| 7,260,293 B1 | 8/2007 | Gunn, III et al. |
| 7,295,455 B2 | 11/2007 | Okuda |

(Continued)

OTHER PUBLICATIONS

Specification and Figures for related U.S. Appl. No. 16/881,736, filed May 22, 2020.

(Continued)

*Primary Examiner* — Tu-Tu V Ho
(74) *Attorney, Agent, or Firm* — Francois Pagette; Andrew M. Calderon; Roberts Calderon Safran & Cole, P.C.

(57) ABSTRACT

The present disclosure relates to integrated circuits, and more particularly, to an anti-tamper x-ray blocking package for secure integrated circuits and methods of manufacture and operation. In particular, the present disclosure relates to a structure including: one or more devices on a front side of a semiconductor material; a plurality of patterned metal layers under the one or more devices, located and structured to protect the one or more devices from an active intrusion; an insulator layer between the plurality of patterned metal layers; and at least one contact providing an electrical connection through the semiconductor material to a front side of the plurality of metals.

18 Claims, 6 Drawing Sheets

(56) References Cited

U.S. PATENT DOCUMENTS

| | | | |
|---|---|---|---|
| 7,884,625 B2* | 2/2011 | Bartley | H01L 23/576 324/686 |
| 8,089,285 B2 | 1/2012 | Hsu et al. | |
| 8,110,894 B2 | 2/2012 | Savry et al. | |
| 8,198,641 B2 | 6/2012 | Zachariasse | |
| 8,664,047 B2 | 3/2014 | Lower et al. | |
| 8,742,830 B2 | 6/2014 | Luo et al. | |
| 8,809,858 B2 | 8/2014 | Lisart et al. | |
| 8,938,627 B2 | 1/2015 | Oggioni et al. | |
| 8,946,859 B2 | 2/2015 | Lisart et al. | |
| 9,075,251 B2 | 7/2015 | Dwivedi et al. | |
| 9,117,833 B2 | 8/2015 | Mougin et al. | |
| 9,306,573 B2 | 4/2016 | McCollum | |
| 9,455,233 B1 | 9/2016 | Bhooshan et al. | |
| 9,565,021 B1 | 2/2017 | Czaplewski et al. | |
| 9,741,670 B2* | 8/2017 | Charbonnier | H04L 9/004 |
| 9,953,727 B1 | 4/2018 | Fifield et al. | |
| 9,965,652 B2 | 5/2018 | Joharapurkar et al. | |
| 11,121,097 B1 | 9/2021 | Jain et al. | |
| 11,171,095 B1 | 11/2021 | Jain et al. | |
| 2001/0033012 A1 | 10/2001 | Kommerling et al. | |
| 2005/0141843 A1 | 6/2005 | Warden et al. | |
| 2010/0026313 A1* | 2/2010 | Bartley | H01L 23/576 324/548 |
| 2010/0059822 A1 | 3/2010 | Pinguet et al. | |
| 2011/0193221 A1 | 8/2011 | Hu et al. | |
| 2014/0035136 A1 | 2/2014 | Buer et al. | |
| 2014/0353849 A1 | 12/2014 | Arora et al. | |
| 2015/0214163 A1 | 7/2015 | Kuenemund et al. | |
| 2016/0307855 A1* | 10/2016 | Charbonnier | H04L 9/004 |
| 2018/0075921 A1 | 3/2018 | Fifield et al. | |
| 2018/0219112 A1 | 8/2018 | Norberg et al. | |
| 2019/0027535 A1 | 1/2019 | Kumar et al. | |
| 2020/0076622 A1 | 3/2020 | Best | |
| 2020/0125716 A1 | 4/2020 | Chittamuru et al. | |
| 2020/0251602 A1 | 8/2020 | Shen et al. | |
| 2020/0328162 A1 | 10/2020 | Haba et al. | |
| 2021/0082532 A1 | 3/2021 | Hunt-Schroeder et al. | |
| 2021/0109283 A1 | 4/2021 | Meagher et al. | |

OTHER PUBLICATIONS

Specification and Figures for U.S. Appl. No. 16/568,394, filed Sep. 12, 2019.
Specification and Figures for U.S. Appl. No. 16/855,185, filed Apr. 22, 2020.
Boyer et al.,"Evaluation of the Near-Field Injection Method at Integrated Circuit Level", Freescale Semiconductor, Inc., Toulouse 31023, France, Sep. 2014, 8 pages.
Manich et al.,"Detection of Probing Attempts in Secure ICs", 2012 IEEE International Symposium on Hardware-Oriented Security and Trust, 6 pages.
Application and Drawings for U.S. Appl. No. 16/881,736, filed May 22, 2020, 24 pages.
Application and Drawings for U.S. Appl. No. 17/223,596, filed Apr. 6, 2021, 23 pages.
Application and Drawings for U.S. Appl. No. 17/525,327, filed Nov. 12, 2021, 37 pages.
Application and Drawings for U.S. Appl. No. 17/525,293, filed Nov. 12, 2021, 24 pages.
Bashir et al., "SecONet: A Security Framework for a Photonic Network-On-Chip", IEEE, 2020, 8 pages.
Zhukovsky et al., "Bragg reflection waveguides as integrated sources of entangled photon pairs", Optical Society of America, vol. 29, No. 9, Sep. 2012, 8 pages.
Giewont et al., "300mm Monolithic Silicon Photonics Foundry Technology", IEEE Journal of Selected Topics in Quantum Electronics, vol. 25, No. 5, Sep./Oct. 2019, 11 pages.
Rakowski et al., "45nm CMOS—Silicon Photonics Monolithic Technology {45CLO) for next-generation, low power and high speed optical interconnects", IEEE, Downloaded on Nov. 15, 2020, 3 pages.
Bian et al., "Towards low-loss monolithic silicon and nitride photonic building blocks in state-of-the-art 300mm CMOS found", Frontiers in Optics/Laser Science© OSA 2020, 2 pages.
Bian et al., "Monolithically integrated silicon nitride platform", OFC 2021 © OSA 2021, 3 pages.
Kumar, "A hollow waveguide Bragg reflector: A tunable platform for integrated photonics", Optics & Laser Technology, vol. 65, Abstract 2 pages.
Li et al., "Direct visualization of phase-matched efficient second harmonic and broadband sum frequency generation in hybrid plasmonic nanostructures", Official journal of the CIOMP 2047-7538, 2020, 10 pages.
Reshef et al., "Direct Observation of Phase-Free Propagation in a Silicon Waveguide", ACS Publications, Jul. 13, 2017, 16 pages.
Sterling, "New Security Risks Create Need for Stealthy Chips", Semiconductor Engineering, Oct. 3, 2019, 6 pages.
Vashistha et al., "Is Backside the New Backdoor in Modern SoCs?", International Test Conference, IEEE, 2019, 10 pages.
Cowen, "Hacking the unhackable", SPIE, Nov. 1, 2020, 8 pages.
Gomez, "How To Hack an Optical Fiber in Minutes . . . And How You Can Secure It", CIENA, Nov. 17, 2016, 3 pages.
Office Action dated Apr. 19, 2021 in related U.S. Appl. No. 16/881,736, 11 pages.
Office Action dated Nov. 25, 2020 in related U.S. Appl. No. 16/881,736, 16 pages.
Shen et al., "Nanopyramid: An optical scrambler against backside probing attacks", Florida Institute for Cyber Security (FICS), Published Online: Nov. 1, 2018, 10 pages.
Response to Office Action dated Jun. 1, 2021 in related U.S. Appl. No. 16/881,736, 9 pages.
Notice of Allowance dated Jun. 11, 2021 in related U.S. Appl. No. 16/881,736, 4 pages.

* cited by examiner

ANTI-TAMPER X-RAY BLOCKING PACKAGE

FIELD OF THE INVENTION

The present disclosure relates to integrated circuits, and more particularly, to an anti-tamper x-ray blocking package for secure integrated circuits and methods of manufacture and operation.

BACKGROUND

When using active x-ray spectrum analysis, a party can observe an integrated circuit under power and a voltage contrast and determine a functional state of the design. Further, it is possible to unlock a private key of devices once a decrypting step of the private key has occurred in a field programmable gate array (FPGA) and the register of the integrated circuit is first used. A known technique to prevent such unlocking can encompass package shielding, but this is still prone to tampering. Accordingly, known techniques have not been able to prevent uncovering of key technology and intellectual property in an integrated circuit.

SUMMARY

In an aspect of the disclosure, a structure comprises: one or more devices on a front side of a semiconductor material; a plurality of patterned metal layers under the one or more devices, located and structured to protect the one or more devices from an active intrusion; an insulator layer between the plurality of patterned metal layers; and at least one contact providing an electrical connection through the semiconductor material to a front side of the plurality of metals.

In another aspect of the disclosure, a structure comprises: at least one device on a front side of semiconductor material; a metal-insular-metal capacitor on a backside of the semiconductor material; at least one contact connecting to a front side of the metal-insular-metal capacitor and which extends through the semiconductor material; and a logic circuit connecting to the plurality of metals via the at least one contact, and which is configured to detect a capacitance change in the backside patterned metal layer.

In another aspect of the disclosure, a method comprises: forming one or more devices on a front side of a semiconductor material; forming a metal-insulator-metal capacitor under the one or more devices, located and structured to protect the one or more devices from an active intrusion; and forming at least one contact providing an electrical connection through the semiconductor material to a front side of the metal-insulator-metal capacitor.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
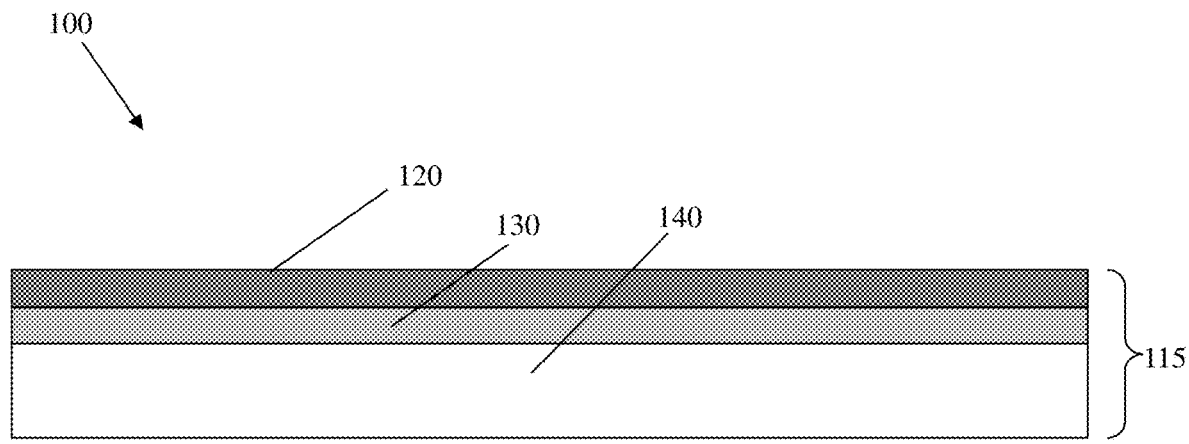
FIG. 1 shows a substrate, amongst other features, and respective fabrication processes, in accordance with aspects of the present disclosure.

The present disclosure relates to integrated circuits, and more particularly, to an anti-tamper x-ray blocking package for secure integrated circuits and methods of manufacture and operation. More specifically, the present disclosure provides multiple buried metal layers forming back end of the line (BEOL) passive devices (e.g., metal-insulator-metal capacitor (i.e., MIM cap), inductor, resistor, etc.) to detect and prevent radio frequency (RF) or an optical probing attack, e.g., x-ray attack. Accordingly and advantageously, the devices described in the present disclosure can prevent an active x-ray attack from determining a functional state of a circuit design and thereby preventing the theft of key technology and intellectual property. In addition, the devices described herein allow RF probing detection, which adds an additional layer of security.

In known circuits, an attack and/or analysis of a circuit functionality can occur on a circuit from scanning a backside of a chip across a die. The attack and/or analysis can capture the function of the device which can then be re-constructed. For example, the analysis can be performed through active and passive optical probing using photo emission (PE), electro-optical frequency modulation, or laser voltage techniques. To avoid such attacks and/or analysis, a charge trap logic structure can be used; however, in this type of circuit, the attack and/or analysis can occur after the charge trap device has been bypassed. Further, package shielding can prevent the attack and/or analysis on a circuit; however, the package shielding is susceptible to tampering.

To solve these and other issues, the present disclosure provides multiple buried metal layers, e.g., buried patterned metal or a backside patterned metal, to "blind" the attacker's x ray system from getting a clear picture of the functional circuit. For example, two or more metals are provided as BEOL structures. These BEOL structures can be resistors, inductors or capacitors for backside attack detection. In use, for example, any tampering to remove the metal changes the capacitance or inductance (of respective capacitor and inductor), which is detected by logic of the integrated circuit. A series of these structures can be added to the chip to "prevent" localized attack. Also, the placement of passive devices in the backside can save valuable chip space on the top side of the wafer, which can now be used for more front end of the line (FEOL) devices or for reduction in overall chip footprint or area.

In more specific embodiments, active and passive devices are formed on a front side of a wafer. A patterned metal is buried between a buried oxide layer (BOX) and a handle wafer with at least two metals and/or a via in between. The patterned metal can be a buried MIM cap. A contact provides an electrical connection from the patterned metal to the front side of the wafer. Further, a logic circuit detects a capacitance change in the patterned metal (like the buried MIM cap) and generates a tamper signal to alter a circuit operation.

In further embodiments, a patterned metal is on a backside of a wafer and buried between a handle wafer and a top wafer with at least two metals and a via in between. A contact provides an electrical connection from the buried metal to the front side of the wafer, and a logic circuit detects a capacitance change in the patterned metal. In further embodiments, multiple structures as described herein can be placed across an integrated circuit to protect against narrow beam direct attacks. These structures can include buried capacitors, inductors, and resistors. The patterned metal layers have dielectric regions under the radio frequency (RF) devices.

The devices of the present disclosure can be manufactured in a number of ways using a number of different tools. In general, though, the methodologies and tools are used to form structures with dimensions in the micrometer and nanometer scale. The methodologies, i.e., technologies, employed to manufacture the devices of the present disclosure have been adopted from integrated circuit (IC) technology. For example, the structures are built on wafers and are realized in films of material patterned by photolithographic processes on the top of a wafer. In particular, the fabrication of the devices uses three basic building blocks: (i) deposition of thin films of material on a substrate, (ii) applying a patterned mask on top of the films by photolithographic imaging, and (iii) etching the films selectively to the mask.

FIG. 1 shows a substrate, amongst other features, and respective fabrication processes. The structure 100 of FIG. 1 can be representative of semiconductor on insulator (SOI) technologies. More specifically, in FIG. 1, the structure 100 includes a substrate 115 composed of semiconductor material 120 bonded or attached to an insulating layer 130, and the insulating layer 130 bonded to a handle wafer 140. The semiconductor material 120 can be bonded to the insulating layer 130 by using wafer bonding techniques and/or other suitable methods. In embodiments, the handle wafer 140 and semiconductor material 120 may be composed of any suitable material including, but not limited to, Si, SiGe, SiGeC, GaAs, InAs, InP, and other III/V or II/VI compound semiconductors.

The insulating layer 130 is also formed by any suitable process, such as separation by implantation of oxygen (SIMOX), oxidation, deposition, and/or other suitable process. The insulator layer 130 comprises any suitable material, including silicon oxide, sapphire, or other suitable insulating materials, and/or combinations thereof. An exemplary insulator layer 130 may be a buried oxide layer (BOX). In embodiments, the semiconductor material 120 and the insulator layer 130 can have a thickness of about 100 nanometers; although other dimensions are also contemplated herein.

Figure 2:
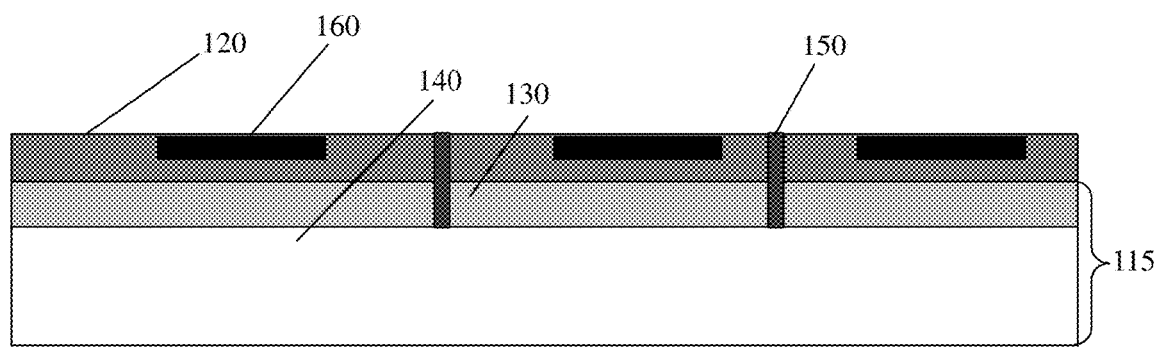
FIG. 2 shows front end of the line (FEOL) devices and substrate contacts, amongst other features, and respective fabrication processes, in accordance with aspects of the present disclosure.

FIG. 2 shows front end of the line (FEOL) devices and substrate contacts, amongst other features and respective fabrication processes. In FIG. 2, devices 160 are formed within or on the semiconductor material 120. The devices 160 can be either active (e.g., logic or RF transistors) or passive devices (e.g., diodes or resistors). For example, the devices 160 can be transistors, resistors, capacitors, combinations thereof, etc. In embodiments, the devices 160 can be formed by conventional CMOS processes such that no further explanation is needed for a complete understanding of the present disclosure.

FIG. 2 further shows a plurality of contacts 150 formed by conventional lithography, etching and deposition methods known to those of skill in the art. For example, a resist formed over the semiconductor material 120 is exposed to energy (light) to form a pattern (opening). An etching process with a selective chemistry, e.g., reactive ion etching (RIE), will be used to form one or more trenches in the semiconductor material 120 and the insulating layer 130 through the openings of the resist. Following the resist removal by a conventional oxygen ashing process or other known stripants, metal material can be deposited within the trenches to form a plurality of contacts 150, e.g., body contacts. In embodiments, the metal material can be aluminum or tungsten (e.g., WSi) or Copper, amongst other materials, deposited by any conventional deposition processes, e.g., chemical vapor deposition (CVD) processes. Any residual material on the surface of the semiconductor material 120 can be removed by chemical mechanical polishing (CMP) processes.

Figure 3:
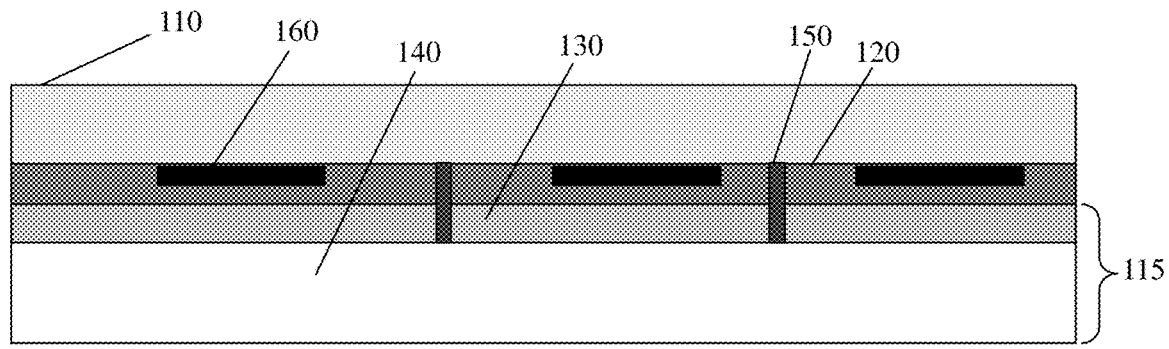
FIG. 3 shows a back end of the line (BEOL) stack, amongst other features, and respective fabrication processes, in accordance with aspects of the present disclosure.

FIG. 3 shows formation of a back end of the line (BEOL) stack, amongst other features and respective fabrication processes. In FIG. 3, the back end of the line (BEOL) stack 110 is formed over the semiconductor material 120 and comprises metal wiring and via interconnects embedded within dielectric material.

Figure 4:
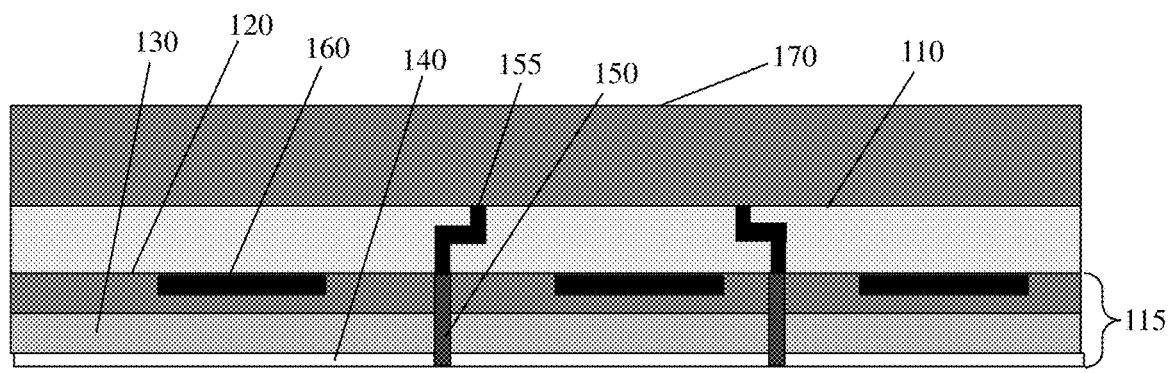
FIG. 4 shows the substrate contacts connected through the BEOL stack, amongst other features, and respective fabrication processes, in accordance with aspects of the present disclosure.

FIG. 4 shows substrate contacts 150 connected through the BEOL stack 110, amongst other features and respective fabrication processes. In particular, a plurality of substrate contacts 155 are formed though the dielectric material of the BEOL stack 110 using conventional lithography, etching and deposition methods as already described herein. The substrate contacts 155 can be electrically connected to the plurality of contacts 150.

Still referring to FIG. 4, a dummy handle wafer 170 is attached to the BEOL stack 110 by conventional bonding processes. For example, the dummy handle wafer 170 can be bonded to the BEOL stack 110 by contact bonding or thermo-compression bonding. Contact bonding uses a liquid-like curable adhesive layer that is coated onto a carrier wafer; whereas, thermo compression process comprises heating and applying thermal and mechanical pressure to two joining bodies. Further, a thinning of the backside (e.g., the handle wafer 140) is performed by a chemical mechanical polishing (CMP) process, as known by one of ordinary skill in the art.

Figure 5:
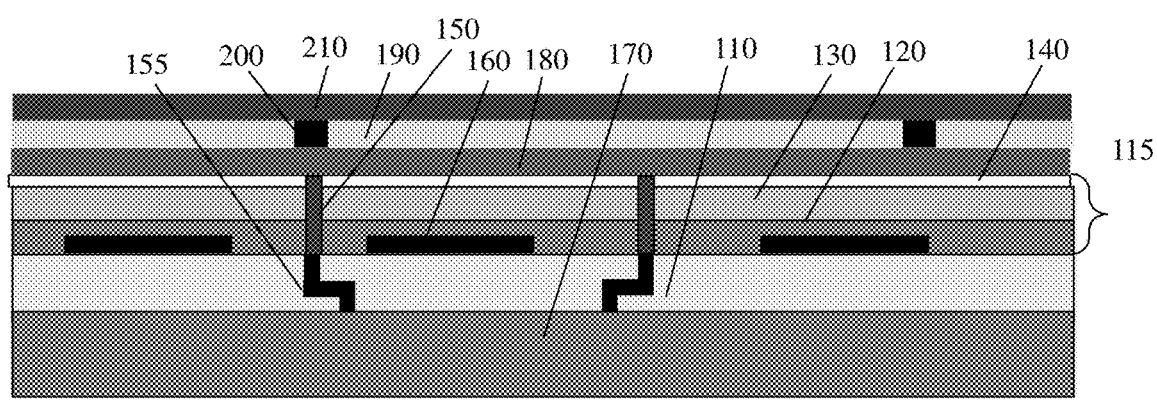
FIG. 5 shows metal and dielectric material on an underside of the flipped structure of FIG. 4, amongst other features, and respective fabrication processes, in accordance with aspects of the present disclosure.

In FIG. 5, the structure 100 of FIG. 4 is flipped over, e.g., upside down. A first metal 180 is deposited on the wafer 130 by conventional deposition methods, followed by a patterning process, e.g., lithography and etching, to form different metal patterns. An insulator material 190 is deposited over the first metal 180 by conventional deposition techniques, e.g., CVD. A plurality of via contacts 200 are formed in the insulator material 190 using conventional lithography, etching and deposition processes as already described herein. The via contacts 200 extend through the insulator layer 190 and contact the patterned metal layer 180. A second metal 210 is deposited over the insulator layer 190, followed by a patterning process. In this way, a MIM capacitor can be formed from the combination of the patterned metals 180, 210 and the insulator layer 190. The MIM capacitor can have many different structural configurations, depending on the patterning. For example, and as discussed in more detail below, the MIM capacitor can be provided in a gridded format. These patterned metal structures can also be representative of an inductor.

Figure 6:
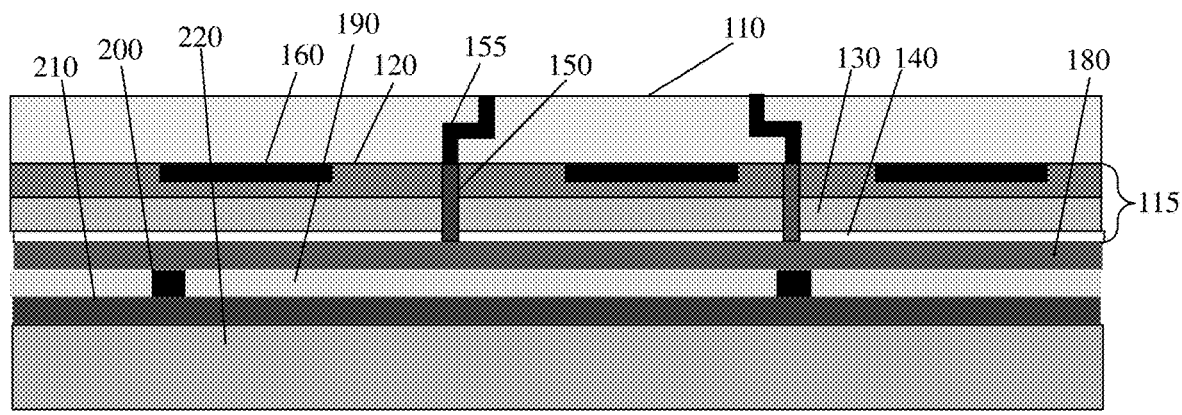
FIG. 6 shows a wafer bonding, amongst other features, and respective fabrication processes, in accordance with aspects of the present disclosure.

In FIG. 6, the structure is flipped back, e.g., right side up. Following the flip process, the dummy handle wafer 170 is removed by conventional processes including mechanical polishing, debonding or other known process. The removal of the dummy handle wafer 170 will expose the BEOL stack 110. A handle wafer 220 is attached to the second metal 210 by conventional bonding processes, e.g., contact bonding or thermo-compression bonding. In embodiments, the handle wafer 220 is attached to the second metal 210 prior to the removal of the dummy handle wafer 170.

Figure 7:
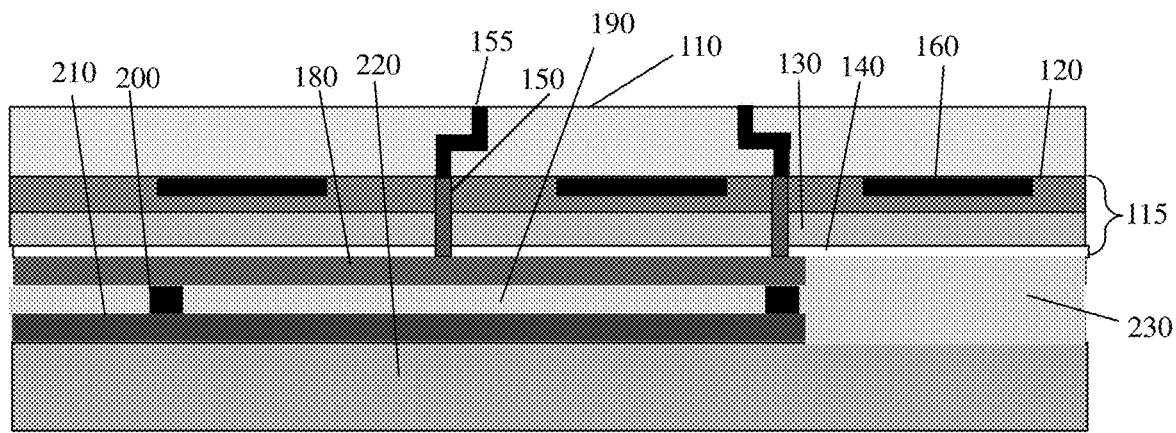
FIG. 7 shows a non-metal region after wafer bonding, amongst other features, and respective fabrication processes, in accordance with aspects of the present disclosure.

FIG. 7 shows an optional insulator material 230 region under radio-frequency (RF) devices. This optional insulator material 230 prevents any interference of the BEOL metal stack with the RF devices which can affect RF performance. In embodiments, the insulator material 230 region comprises a dielectric material which can be formed by either an additive or subtractive process known to those of skill in the art. For example, in a subtractive process, the layers 180, 190, 200 can be removed by selective chemistries (e.g., RIE process), followed by a deposition of the insulator material 230. In an additive process, the insulator material 230 can first be deposited, followed by partially removal for the formation of the appropriate devices, stacks, etc.

By implementing the processes described herein, the present disclosure includes a SOI wafer and utilizes a layer transfer process to form patterned metals (e.g., which form a capacitive structure) between the insulator layer 130 (i.e., the BOX layer) and the handle wafer 220. Further, the buried patterned metallization (i.e., the first metal 180 and the second metal 210) with body contacts (i.e., contacts 150) is connected to a logic circuit. The logic circuit can be utilized to detect any tampering of the backside metal (i.e., the first metal 180 and the second metal 210). For example, any attempts to remove the handle wafer 220 and the buried metal (i.e., the first metal 180 and the second metal 210) will result in a higher capacitance measured by the logic circuit through contacts 150, which will trigger a tamper signal. The logic circuit for detecting capacitance changes can be any known circuit design.

Figure 8:
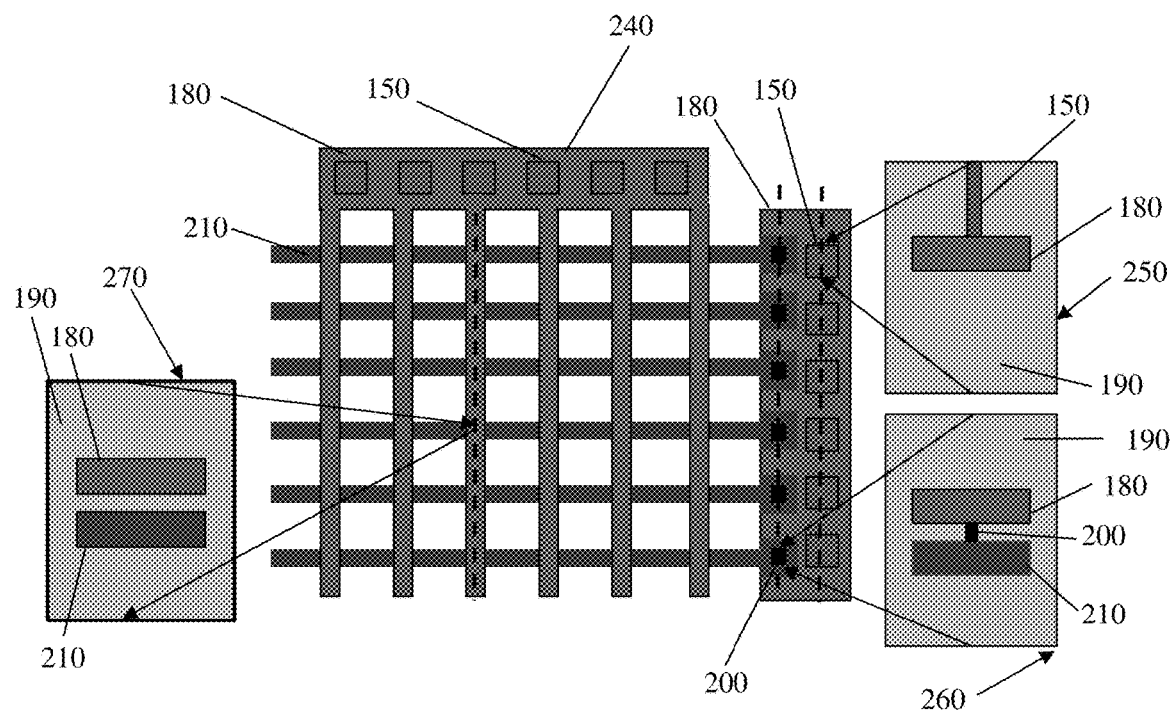
FIG. 8 shows a plan view of a buried capacitor structure with via structures, amongst other features, and respective fabrication processes, in accordance with additional aspects of the present disclosure.
Figure 9:
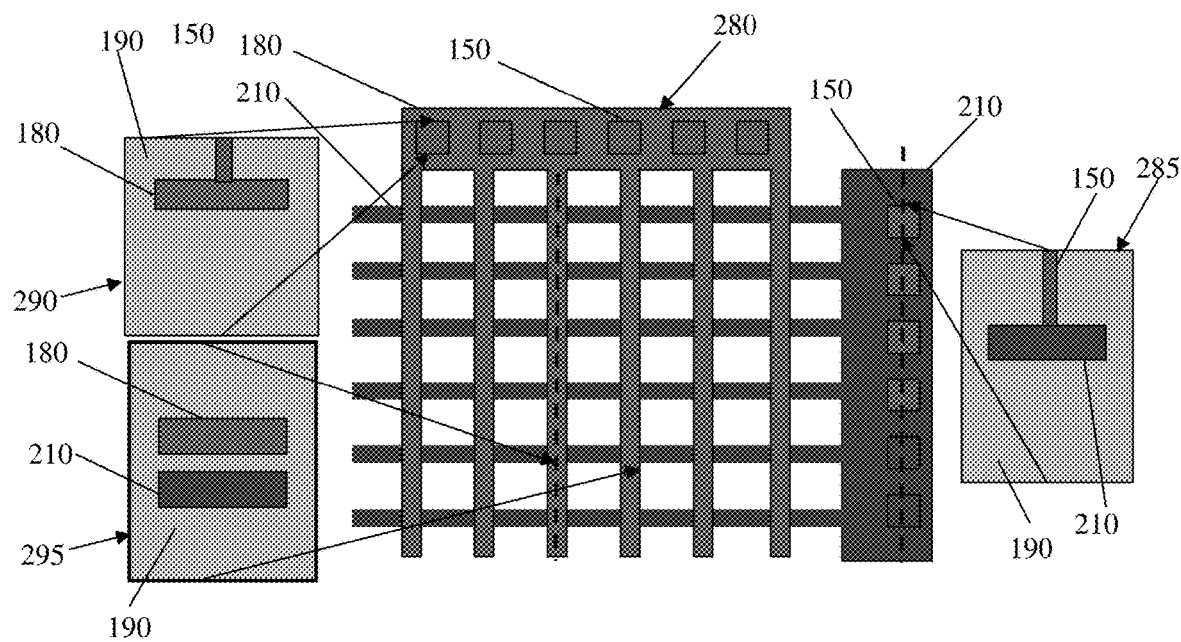
FIG. 9 shows a plan view of a buried capacitor structure without via structures, amongst other features, and respective fabrication processes, in accordance with additional aspects of the present disclosure.

FIGS. 8 and 9 show plan views of a MIM capacitor formed from the combination of the first metal 180, the second metal 210, and the insulator layer 190 using SOI technologies (e.g., similar to FIG. 7). In a top view 240 of the structure 100 of FIG. 8, the buried capacitor structure (i.e., MIM capacitor) includes the first metal 180 overlaid over the second metal 210 in a grid pattern, e.g., criss-cross/mesh pattern, on the backside of the device. The grid pattern effectively blocks X-ray attacks from seeing a functional circuit. It should be understood that other patterns (i.e., circle mesh, square mesh, rectangular mesh, and solid mesh) and dimensions of the mesh are contemplated by the present disclosure. In the present disclosure, a change in capacitance is detected when an attacker tires to remove the grid pattern.

Still referring to FIG. 8, the contacts 150 are provided in a buried oxide (BOX) layer (i.e., the insulating layer 130) close to the handle wafer 140. The contacts 150 are also on top of and connected to the first metal 180. Further, the first metal 180 is connected to the second metal 210 through the via contacts 200. In an x-section view 250, the contacts 150 are on top of the first metal 180 in the insulator 190. In an x-section view 260, the first metal 180 is connected to the second metal 210 through the via contacts 200. In an x-section 270, the first metal 180 is on top of the insulator 190 and the insulator 190 is on the second metal 210.

In FIG. 9, there is no via contact as is the case with the structure shown in FIG. 8. Similar to FIG. 8, in FIG. 9, the first metal 180 and the second metal 210 form a metal-insulator-metal capacitor (i.e., MIM capacitor). Further, the contacts 150 are provided in a buried oxide (BOX) layer (i.e., the insulating layer 130) close to the handle wafer 140. In FIG. 9, the MIM capacitor is configured as a grid pattern; although other patterns (i.e., circle mesh, square mesh, rectangular mesh, and solid mesh) and dimensions are contemplated by the present disclosure.

Still referring to FIG. 9, in an x-section view 285, the contacts 150 are on top of the second metal 210 in the insulator 190. In an x-section view 290, the contacts 150 are on top of the first metal 180. In an x-section 295, the first metal 180 is on top of the insulator 190 and the insulator 190 is on the second metal 210.

Figure 10:
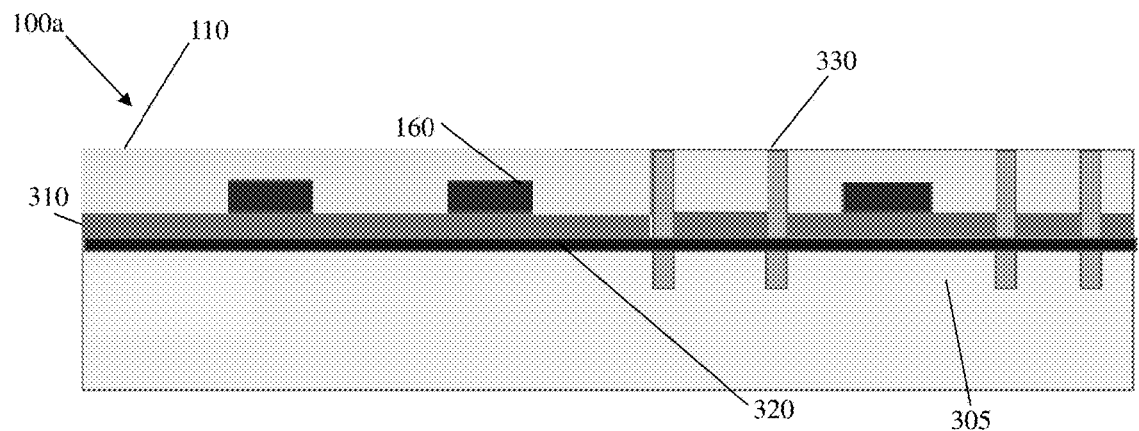
FIG. 10 shows a bulk silicon wafer with an etch stop layer and BEOL stack, amongst other features, and respective fabrication processes, in accordance with additional aspects of the present disclosure.
Figure 11:
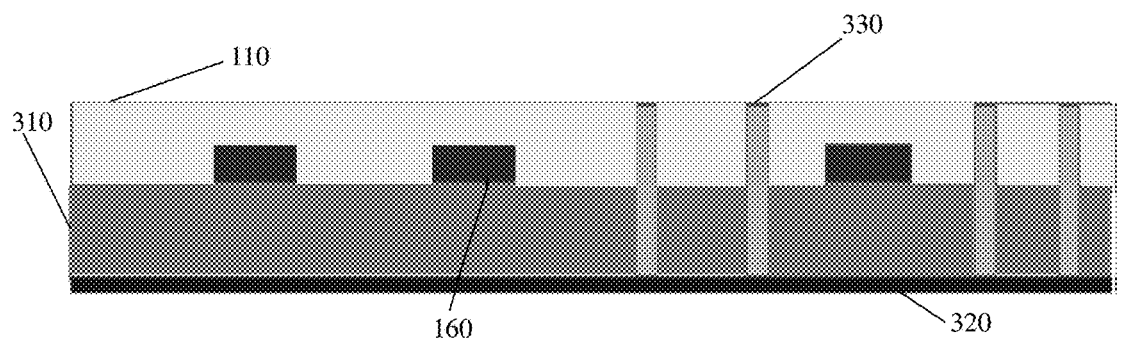
FIG. 11 shows a thinned wafer of FIG. 10, amongst other features, and respective fabrication processes, in accordance with aspects of the present disclosure.
Figure 12:
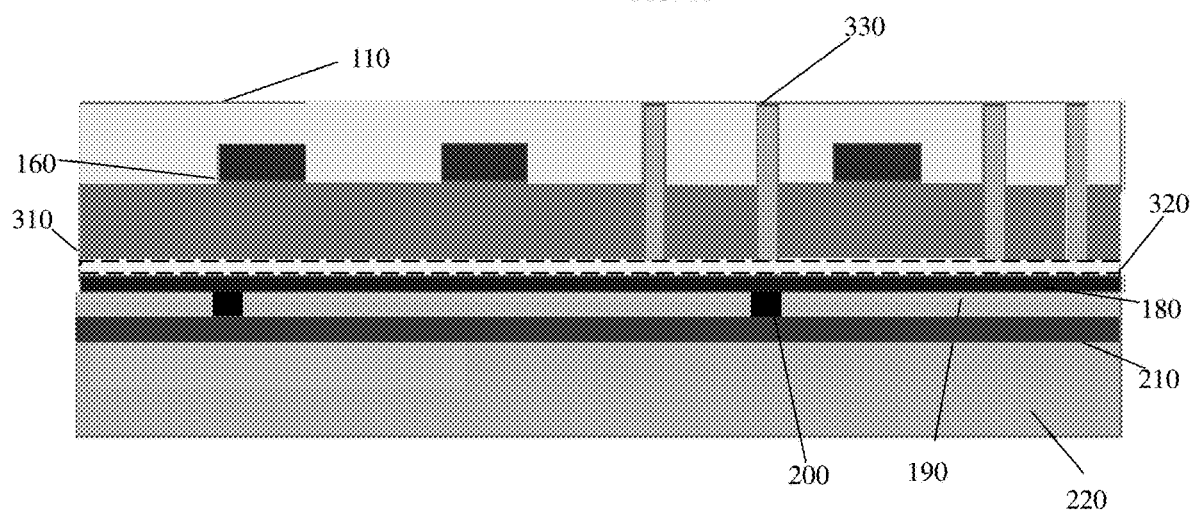
FIG. 12 shows a backside patterned metal layer on a backside of semiconductor material, amongst other features, and respective fabrication processes, in accordance with additional aspects of the present disclosure.

FIGS. 10-12 show a through-silicon via (TSV) process and related structures with a backside metal in accordance with aspects of the present disclosure. In FIG. 10, the structure 100a includes a bulk silicon wafer 305 with a silicon germanium (SiGe) material 320 grown on the bulk silicon wafer 305. In particular, the SiGe material 320 can be 10-20% Ge and 80-90% Si. The SiGe material 320 can be 100 nanometers or thicker to act as a marker layer, e.g., etch stop, and the bulk wafer 310 can be about 0.1 to 100 microns; although other dimensions are also contemplated herein. In embodiments, the semiconductor material 310 can be single crystalline Si material; although other semiconductor materials as noted herein are also contemplated. In further embodiments, the SiGe stack 320 can be excluded, with an etch being performed based on a final wafer thickness.

In FIGS. 10 and 11, the back end of the line (BEOL) stack 110 is formed on the semiconductor material 310 by conventional CMOS processes as already described herein. In embodiments, the BEOL stack 110 can comprise a stack of metals and vias for wiring including inductors, resistors, and capacitors. Further, devices 160 are formed on the semiconductor material 310. The devices 160 can be either active or passive devices (e.g., RF devices) as described herein. Further, for the TSV process on the bulk wafer, the backside of the wafer is thinned to expose the TSV metal on the bottom. Depending on the final thickness of the wafer, similar to FIG. 4, there may need to be a dummy handle wafer (e.g., if the final thickness of the wafer is under 50 microns).

FIGS. 10-12 shows a plurality of through-silicon via (TSV) contacts 330 formed by conventional lithography, etching and deposition methods known to those of skill in the art such that no further explanation is required for an understanding of the present disclosure. The TSV contacts 330 can extend through the BEOL stack 110, semiconductor material 310, SiGe material 320, and into the wafer 305.

In FIG. 12, the wafer 305 is thinned to a depth of the SiGe material 320. Due to the material selectivity between the wafer 305 and SiGe material 320, the SiGe material 320 can be used as an etch stop layer during a backside etch. Following the SiGe material 320 removal, the TSVs 330 are exposed and a first metal 180 is deposited by conventional deposition methods, followed by a patterning process, e.g., lithography and etching, to form different metal patterns as already described herein. An insulator layer 190 (e.g., a dielectric) is deposited to the backside of the first metal 180 by conventional techniques, e.g., CVD. A plurality of via contacts 200 are formed within the insulator layer 190 by conventional lithography, etching and deposition methods as already described herein. The via contacts 200 can extend through the insulator 190. A second metal 210 is formed to the backside of the insulator 190, which is also patterned. In an optional embodiment, a handle wafer 220 can be attached to the second metal 210 by conventional bonding processes. For example, the handle wafer 220 can be bonded to the second metal 210 by contact bonding or thereto-compression bonding.

In alternative embodiments, the SiGe material 320 can remain on the semiconductor material 310 as shown representatively in FIG. 12 by the dashed line. In this embodiment, the first metal layer 180 is formed on the backside of the SiGe material 320, in electrical contact with the TSV contacts 330. In any of the embodiments and as previously noted, metallization (i.e., first metal 180 and second metal 210 to form a capacitor or inductor) on the backside of the wafer will prevent scanning electron microscope/transmission electron microscope (SEM/TEM) electrons from reaching the device 160.

Figure 13:
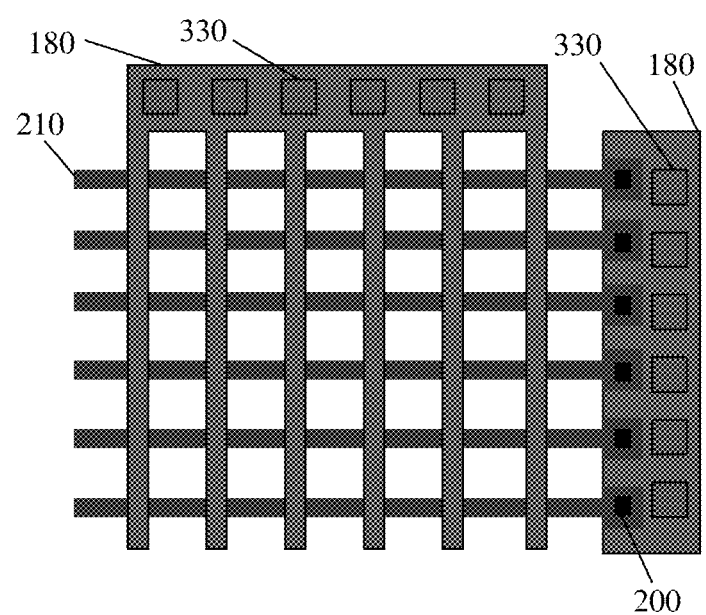
FIG. 13 shows a plan view of a buried capacitor structure in a bulk wafer, amongst other features, and respective fabrication processes, in accordance with additional aspects of the present disclosure.

FIG. 13 shows a top view of FIG. 12, which includes a buried capacitor structure in a bulk wafer, amongst other features. The buried capacitor structure can also be representative of an inductor. In particular, FIG. 13 shows the TSV contacts 330, the first metal 180, the via contacts 200, and the second metal 210. In FIG. 13, the first metal 180 and the second metal 210 form a metal-insulator-metal capacitor (i.e., MIM capacitor). Further, the TSV contacts 330 are built in the BEOL stack 110 and the semiconductor material 310. In FIG. 13, the MIM capacitor (i.e., the first metal 180 and the second metal 210) is configured as grid pattern, e.g., mesh/criss-cross pattern, to block any X-ray attacks. Again, other patterns (i.e., circle mesh, square mesh, rectangular mesh, and solid mesh) and dimensions of the mesh can be used in the present disclosure. In the present disclosure, a change in capacitance is detected when an attacker tires to remove the grid pattern.

By implementing the processes described herein, patterned backside metallization (i.e., the first metal 180 and the second metal 210) with TSV contacts 330 connected to a logic circuit which can be utilized to detect tampering. For example, any attempts to remove the insulator 190 and the buried metal (i.e., the first metal 180 and the second metal 210) will result in a higher capacitance measured by the logic circuit through TSV contacts 330. This, in turn, will trigger a tamper signal. The logic circuit for detecting capacitance changes can be any known circuit design.

In still further embodiments, the first metal 180 and the second metal 210 can be used as resistors, capacitors, and/or inductors for detecting a backside attack. The location of the first metal 180 and the second metal 210 in the backside of the structures 100, 100a can save space on the top of a wafer. Further, a series of the structures 100, 100a can be added to a chip to prevent localized attacks. In further embodiments, a unique signature can be programmed into a system by applying a different photo composition on chips and/or wafers.

In further embodiments, a buried MIM capacitor as described above can be implemented with a planar inductor and a front end of the line (FEOL) circuit used as a simple inductance-capacitance (LC) oscillator. This is represented with the first metal 180, the second metal 210, and the insulator layer 190 (i.e., MIM capacitor) with an inductor and a FEOL circuit. In these implementations, electromagnetic (EM) or radio frequency (RF) injection probing attacks will change the inductance (L) or capacitance (C) of a circuit which can be detected by a change in an oscillation/resonant frequency of an LC oscillator. In an example, one plate or metal layer (i.e., backside) can be connected to one node of the LC circuit and can be used to detect a change in capacitance. If part of the metal layer is damaged in any way, it causes a change in capacitance of the system, which translates to a change in frequency that can be measured by a device (i.e., an inductance to digital converter (LDC) or a frequency digital converter (FDC) can detect a change in L/C or a filter can be used). Further, if there is a RF probe attack near the MIM capacitor or the backside of a chip, this can be detected using the MIM capacitor and/or an inductor.

An anti-tamper x-ray blocking package can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as Smartphones) and edge computing markets. SoC is also commonly used in embedded systems and the Internet of Things.

The structures and methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   one or more devices on a front side of a semiconductor material;
   a plurality of patterned metal layers under the one or more devices, located and structured to protect the one or more devices from an active intrusion;
   an insulator layer between the plurality of patterned metal layers; and
   at least one contact providing an electrical connection through the semiconductor material to a front side of the plurality of metals,
   wherein the one or more devices comprise at least one radio frequency (RF) device and a region under the at least one RF device is an insulator material devoid of the plurality of patterned metal layers.

2. The structure of claim 1, wherein the plurality of patterned metal layers and the insulator layer are a metal-insulator-metal (MIM) capacitor.

3. The structure of claim 2, wherein the one or more devices are front end of the line devices and the MIM capacitor is on different device layers.

4. The structure of claim 3, wherein the plurality of patterned metal layers comprise a first metal overlaid on a second metal to form a grid pattern.

5. The structure of claim 1, wherein the plurality of patterned metal layers is an inductor.

6. The structure of claim 1, further comprising a logic circuit connected to the plurality of patterned metal layers and configured to detect a capacitance change in the plurality of patterned metal layers.

7. The structure of claim 6, wherein the logic circuit is configured to generate a tamper signal to alter a circuit operation in response to the detected capacitance change.

8. The structure of claim 1, wherein:
   the insulator layer is under the semiconductor material,
   a wafer is below the insulator layer,
   the plurality of patterned metal layers is below the semiconductor material, and
   the at least one contact is provided through the semiconductor material.

9. The structure of claim 1, further comprising a handle wafer, wherein:
   the semiconductor material is bulk Si, and
   the plurality of patterned metal layers is positioned between the handle wafer and the bulk Si.

10. The structure of claim 9, further comprising a marker layer which is different than the bulk Si, wherein:
    the marker layer is on an underside of the bulk Si;
    the plurality of metals is on an underside of the marker layer; and
    the at least one contact is a plurality of through silicon vias extending through the marker layer and in contact with at least one metal of the plurality of metals along its length.

11. A structure, comprising:
    at least one device on a front side of semiconductor material;
    a metal-insulator-metal capacitor on a backside of the semiconductor material;
    at least one contact connecting to a front side of the metal-insulator-metal capacitor and which extends through the semiconductor material; and
    a logic circuit connecting to a plurality of metals via the at least one contact, and which is configured to detect a capacitance change in a backside patterned metal layer,
    wherein the metal-insulator-metal capacitor is a grid pattern with a top metal material and a bottom metal material patterned in different orientations.

12. The structure of claim 11, wherein the metal-insular-metal capacitor includes a plurality of patterned metal layers buried between a wafer and the semiconductor material.

13. The structure of claim 11, wherein the at least one contact is a plurality of contacts along a length of the metal-insular-metal capacitor.

14. The structure of claim 11, wherein the at least one contact is a plurality of through-silicon vias (TSVs).

15. The structure of claim 11, further comprising a wafer located underneath the semiconductor material, wherein the semiconductor material is a bulk semiconductor material and the metal-insular-metal capacitor is buried between the wafer and the bulk semiconductor material.

16. The structure of claim 15, further comprising an etch stop layer between the bulk semiconductor material and the metal-insulator-metal capacitor.

17. The structure of claim 11, wherein the metal-insular-metal capacitor is positioned and structured to prevent an attack from reaching the at least one device, and the logic circuit is configured to generate a tamper signal to alter a circuit operation in response to a detected capacitance change of the metal-insular-metal capacitor.

18. A method, comprising:
    forming one or more devices on a front side of a semiconductor material;
    forming a metal-insulator-metal capacitor under the one or more devices, located and structured to protect the one or more devices from an active intrusion; and
    forming at least one contact providing an electrical connection through the semiconductor material to a front side of the metal-insulator-metal capacitor,
    wherein the metal-insulator-metal capacitor is a grid pattern with a top metal material and a bottom metal material patterned in different orientations.

* * * * *